(12) United States Patent
Vissenberg et al.

(10) Patent No.: US 10,756,074 B2
(45) Date of Patent: Aug. 25, 2020

(54) LIGHT EMITTING ASSEMBLY, A SPOT LAMP AND LUMINAIRE

(71) Applicant: SIGNIFY HOLDING B.V., Eindhoven (NL)

(72) Inventors: Michel Cornelis Josephus Vissenberg, Roermond (NL); Ludovicus Johannes Lambertus Haenen, Sint Oedenrode (NL); Jan De Graaf, Uden (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/495,099

(22) PCT Filed: Mar. 15, 2018

(86) PCT No.: PCT/EP2018/056506
§ 371 (c)(1),
(2) Date: Sep. 17, 2019

(87) PCT Pub. No.: WO2018/172175
PCT Pub. Date: Sep. 27, 2018

(65) Prior Publication Data
US 2020/0020675 A1    Jan. 16, 2020

(30) Foreign Application Priority Data
Mar. 21, 2017   (EP) .................................... 17161953

(51) Int. Cl.
*H01L 25/13* (2006.01)
*F21K 9/68* (2016.01)
(Continued)

(52) U.S. Cl.
CPC ................ *H01L 25/13* (2013.01); *F21K 9/68* (2016.08); *F21S 8/06* (2013.01); *F21Y 2105/12* (2016.08);
(Continued)

(58) Field of Classification Search
None
See application file for complete search history.

(56) References Cited

U.S. PATENT DOCUMENTS

| | | | |
|---|---|---|---|
| 8,446,547 B2 | 5/2013 | Kim | |
| 8,735,914 B2 | 5/2014 | Agatani et al. | |

(Continued)

FOREIGN PATENT DOCUMENTS

WO       2013094481 A1     6/2013

*Primary Examiner* — Elmito Breval
(74) *Attorney, Agent, or Firm* — Daniel J. Piotrowski

(57) ABSTRACT

A light emitting assembly (100), a spot lamp and a luminaire are provided. The light emitting assembly comprises at least one first package (110) with a solid-state light emitting a first color of light, a second package (120) with a solid-state light emitter emitting a second color of light and a third package (130) with a solid-state light emitter emitting a third color of light. The first package has a smallest side (w1) that is at least 60% smaller than the sides (w2, w3, l2, l3) of the second package and the third package. The packages are provided on a substrate (140). Seen in along a view direction towards a top surface of the substrate; an envelope around said packages is a circle or an ellipse (150) having a center (152), one first package is positioned on the center, or two first packages are provided at positions adjacent to the center and intersect with a virtual line through the center.

14 Claims, 7 Drawing Sheets

(51) Int. Cl.
   *F21Y 105/12*   (2016.01)
   *F21Y 113/13*   (2016.01)
   *F21Y 115/10*   (2016.01)
   *F21S 8/06*     (2006.01)

(52) U.S. Cl.
   CPC ........ *F21Y 2113/13* (2016.08); *F21Y 2115/10* (2016.08)

(56) References Cited

U.S. PATENT DOCUMENTS

| | | |
|---|---|---|
| 2004/0108818 A1 | 6/2004  | Cok et al. |
| 2007/0263384 A1 | 11/2007 | Hsieh et al. |
| 2009/0147508 A1 | 6/2009  | Bertram et al. |
| 2013/0214302 A1 | 8/2013  | Yeh et al. |
| 2015/0357372 A1 | 12/2015 | Van De Ven et al. |
| 2016/0013164 A1 | 1/2016  | Tudorica et al. |
| 2016/0284949 A1 | 9/2016  | Hagelaar et al. |

LIGHT EMITTING ASSEMBLY, A SPOT LAMP AND LUMINAIRE

CROSS-REFERENCE TO PRIOR APPLICATIONS

This application is the U.S. National Phase application under 35 U.S.C. § 371 of International Application No. PCT/EP2018/056506, filed on Mar. 15, 2018, which claims the benefit of European Patent Application No. 17161953.9, filed on Mar. 21, 2017. These applications are hereby incorporated by reference herein.

FIELD OF THE INVENTION

The invention relates to a light emitting assembly.
The invention further relates to a spot lamp and to a luminaire.

BACKGROUND OF THE INVENTION

Many lighting devices use Light Emitting Diodes (LEDs) as a light emitter and often such a LED is provided with a luminescent material to obtain a specific light emission. A combination of a LED with a specific luminescent material to emit a specific color of light is termed a LED assembly in this background of the art section. In several lighting devices, LED assemblies of different types (that emit different colors of light) are used in a single device to obtain a specific light emission having, for example, a predefined color, a predefined color temperature, a predefined color rending index, a specific power output, and/or a specific wavelength distribution. Sometimes different LED assemblies are used that are controlled individually or controlled in groups to obtain a controllable light source of which, for example, the emitted color of light or the emitted color temperature can be controlled.

US 2013/0214302A1 discloses a substrate with a plurality of light emitting diode chips, comprising at least a first, a second and a third light emitting diode chip. The substrate comprises a plurality of different shaped concaves for proper placement of the light emitting diode chips.

Published U.S. Pat. No. 8,735,914, which is incorporated by reference, discloses a light emitting device in which a plurality of different types of LED assemblies are provided on a substrate. Groups of LEDs are formed, and each group comprises the same type of LED assembly. Within the groups, LEDs are placed close to each other and the groups are placed adjacent to each other. Electrical connections and electrodes are provided such that each group can be controlled individually. The substrate with LED assemblies is relatively small and can be arranged in a retrofit light bulb.

A problem of the latter cited patent is that the different light emissions of the different groups do not mix very well. Therefore, if no additional light mixing means is provided, the emitted light beam has different colors of light in different parts of the light beam. Therefore, the light emitting device of the cited patent can only be used in lamp designs where diffusers or light mixing chambers are available. However, there is a need to use different types of LED assemblies also in a spot lamp, for example in combination with a reflector. In particular, in spots, it is very important that different colors of light are well mixed into the emitted light beam to prevent, for example, that portions of the illuminated area appear to have different colors.

SUMMARY OF THE INVENTION

It is an object of the invention to provide a lighting assembly with different light emitters that emits, compared to the prior art, a light beam in which different colors of light are better mixed. The object relates to the use of at least three different types of light emitters that emit, in use, different colors of light.

An aspect of the invention provides a light emitting assembly. Another aspect of the invention provides a spot lamp. A further aspect of the invention provides a luminaire. Advantageous embodiments are defined in the dependent claims.

A light emitting assembly in accordance with the aspect of the invention comprises at least one first package, a second package, a third package and a substrate. The at least one first package is of a first type of solid-state light emitter package that emits, in use, a first color of light. The second package is of a second type of solid-state light emitter package that emits, in use, a second color of light. The third package is of a third type of solid-state light emitter package that emits, in use, a third color of light. Seen in a top view, a smallest side of the first type of solid-state light emitter package is at least smaller than 60% of, seen in the top view, the length and the width of the second type of solid-state light emitter package and the length and the width of the third type of solid-state light emitter package. The substrate comprises the first package, the second package and the third package on a surface. Seen along a viewing direction towards a surface of the substrate on which said packages are provided: a shape of an envelope around said packages is a circle or an ellipse. The circle and the ellipse having a center. Seen along a viewing direction towards a surface of the substrate on which said packages are provided: one first package is positioned on the center, or, if the two first packages are provided, the two first packages are provided at positions adjacent to the center and intersect with a virtual line through the center (i.e. an imaginary straight line crossing the center of the envelope). Optionally, the first type of solid-state light emitter package is, seen in a top view, elongated. Optionally, if two first packages are provided at positions adjacent to the center, a longitudinal direction of each one of the two first packages forms an angle with respect to the virtual line, the angles are smaller than 60 degrees. Alternatively, the first packages that intersect with the virtual line are arranged such that their longitudinal direction follows the direction of the virtual line. Optionally, the first type of solid-state light emitter package has, seen in a top view, an aspect ratio between a width and length smaller than 0.75. Optionally, at least one of the second type of solid-state light emitter package and the third type of solid-state light emitter package have, seen in a top view, an aspect ratio between a width and a length that is within a range from 0.75 to 1, wherein the width is the shortest side and the length is the longest side.

The light emitting assembly according to the aspect of the invention is better able to emit a light beam of a homogeneous color. The different colors of light, as emitted, are better mixed. The better mixing is the result of the fact that the first package, which is in at least one dimension small compared to the second and the third package, is placed in the middle (for example, placed on the center or two first packages are placed on a line through the center and the two first package are placed adjacent to the center). The second and third packages are arranged around this first package, for example, on opposite side of the first package, and thereby the distance between the large first and second package is relatively small and their light is well mixed. At the same time the light of the first package is emitted at the center of the beam and is, consequently, well mixed with the light of the second package and the third package. In particular, less color differences can be observed in the light that has a relatively large angle with respect to a central light ray of the emitted light beam.

Optionally, the light emitting assembly comprises a plurality of second packages and a plurality of third packages. The first packages that do not intersect with the virtual line, the plurality of second packages and the plurality of third packages are substantially equally distributed along a space within the envelope that is not used for the first packages that intersect with the virtual line. Optionally, the light emitting assembly comprises a plurality of second packages and a plurality of third packages. Remaining packages are the first packages that do not intersect with the virtual line, the plurality of second packages and the plurality of third packages. The remaining packages are distributed along a space within the envelope that is not filled with the first packages that intersect with the virtual line such that the remaining packages intersect with one of one or more virtual concentric ellipses around the center. Along the one or more concentric ellipses, adjacent packages are of a different type. Optionally, all packages are distributed along the substrate in a point symmetrical manner with respect to the center.

The optional embodiments of the previous paragraph provide a better color mixing, optionally a higher light output and make the light emitting assembly useful for a (retrofit) spot lamp. The light is well mixed and well concentrated.

According to another aspect, a spot lamp is provided that comprises an embodiment of the light emitting assembly.

According to a further aspect, a luminaire is provided that comprises an embodiment of the spot lamp or that comprises an embodiment of the light emitting assembly.

The spot lamp according to the another aspect of the invention and the luminaire according to the further aspect of the invention provide the same benefits as the light emitting assembly according to the aspect of the invention and has similar embodiments with similar effects as the corresponding embodiments of the system.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the assembly, the spot lamp or the luminaire, which correspond to the described modifications and variations of the assembly, can be carried out by a person skilled in the art on the basis of the present description.

BRIEF DESCRIPTION OF THE DRAWINGS

These and other aspects of the invention will be apparent from and elucidated further with reference to the embodiments described by way of examples in the following description and with reference to the accompanying drawings, in which FIG. 1a schematically shows a top view of a first embodiment of a light emitting assembly, FIG. 1b schematically shows a three-dimensional view of the embodiment of the light emitting assembly of FIG. 1a, FIG. 2a schematically shows a top view of a second embodiment of a light emitting assembly, FIG. 2b schematically shows a top view of a third embodiment of a light emitting assembly, FIG. 3 schematically shows a top view of a fourth embodiment of a package arrangement on a substrate (not shown separately) of a light emitting assembly together with an enlargement of a section of the fourth embodiment, FIG. 4 schematically shows a top view of a fifth embodiment of a package arrangement on a substrate (not shown separately) of a light emitting assembly, FIG. 5 schematically shows a top view of a sixth embodiment of a package arrangement on a substrate (not shown separately) of a light emitting assembly, FIG. 6 schematically shows a top view of a seventh embodiment of a package arrangement on a substrate (not shown separately) of a light emitting assembly, FIG. 7 schematically shows different angles of an emitted light beam, FIG. 8 schematically shows an embodiment of a spot lamp, and FIG. 9 schematically shows an embodiment of a luminaire.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

Figure 1A:
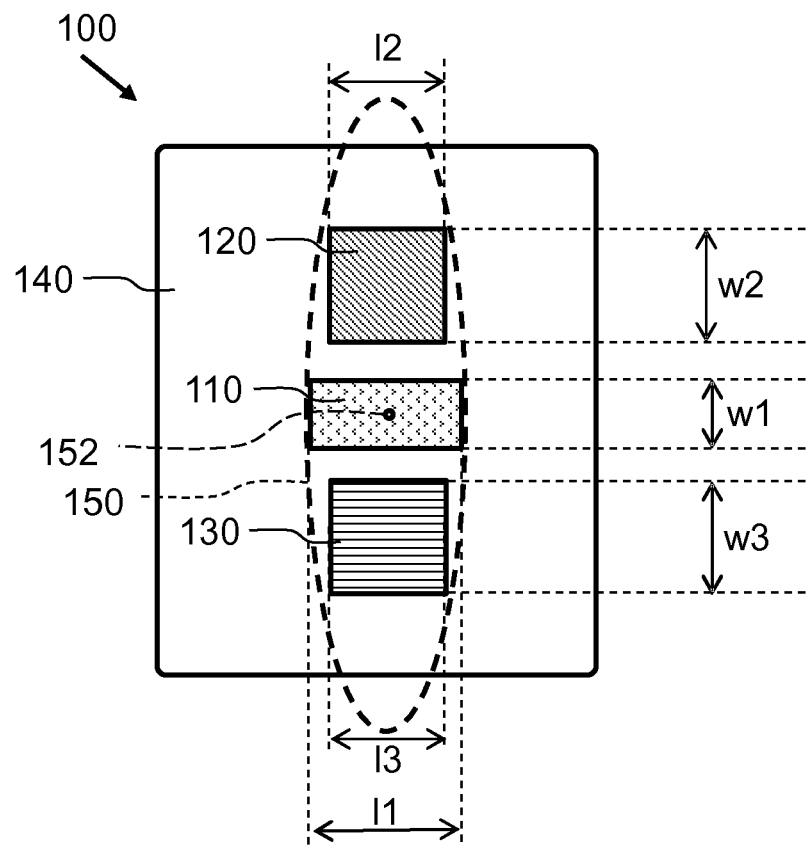

FIG. 1a schematically shows a top view of a first embodiment of a light emitting assembly 100. The light emitting assembly 100 comprises a first package 110, a second package 120, a third package 130 and a substrate 140. The first package 110, the second package 120, and the third package 130 are arranged on a top surface of the substrate 140.

The substrate 140 is a relatively stiff board or structure that is suitable for forming a base for said packages 110, 120, 130. The substrate 140 may be a printed circuit board, may be a ceramic plate, or any other suitable plate shaped embodiment. The substrate 140 may comprise electrical conductive tracks for conducting driving power to said packages 110, 120, 130. The substrate 140 may comprise electrodes for receiving power. The substrate 140 may also comprise specific cooling elements or materials to conduct heat away from said packages 110, 120, 130. The substrate 140 may comprise fastening elements for coupling the substrate with said packages 110, 120, 130 to, for example, a spot lamp housing, luminaire, etc.

The first package 110 is of a first type of a solid-state light emitter package that is configured to emit a first color of light. The second package 120 is of a second type of solid-state light emitter package that is configured to emit a second color of light. The third package 130 is of a third type of solid-state light emitter package that is configured to emit a third color of light. The first color, the second color and the third color of light are different colors of light. The spectral distributions of the light emissions of the first type, the second type and the third type of solid-state light emitter packages may partially overlap with each other, however, the differences between the spectral distributions result in color differences that are visible to the human eye.

In general, a solid-state light emitter package comprises a solid-state light emitter die, for example, a light emitting diode (LED) die and comprise a miniature housing around the solid-state light emitter die together with electrical conductive elements for coupling the solid-state light emitter to electrical power, and the package may further comprise one or more protection elements to protect the solid-state light emitter against environmental influences, one or more optical elements to influence the light emission distribution of the emitted light and may comprise luminescent material to convert a portion of the light emitted by the solid-state light emitter towards light of another color. If the first type of solid-state light emitter package is configured to emit light of the first color, the light of the first color may be the light emitted by the solid-state light emitter, may be a combination of light emitted by the solid-state light emitter and the luminescent material or may be the light that is emitted by the luminescent material if, for example, all light emitted by the solid-state light emitter is converted towards light of the first color. It may also be that one solid-state light emitter package comprises more than one solid-state light emitter die. Several examples of solid-state light emitter packages can be found in the art, for example, in published patent application US2016284949A1.

FIG. 1a is a top view of the light emitting assembly 100, this means that the viewing direction is towards the top surface of the substrate 140. The top surface is the surface on which the packages 110, 120, 130 are provided. In the top view of FIG. 1a, the width w1 and length l1 dimensions of the first package 110 are indicated. In the top view of FIG. 1a, the width w2 and length l2 dimensions of the second package 120 are indicated. In the top view of FIG. 1a, the width w3 and length l3 dimensions of the third package 130 are indicated. The indicated dimensions are, thus, the dimensions of the packages of the first type of solid-state light emitter packages, the packages of the second type of solid-state light emitter packages, and the packages of the third type of solid-state light emitter packages, respectively. If in the following of this document a width or length of a specific package is discussed, the discussion also relates to all packages of the same type. In the above, and in the following, the width of a package is a shortest side of the package and the length of the package is a longest side of the package.

In the context of this document, and seen in a top view, the first package 110 has a size in which the shortest side of the first package 110 is at least smaller or equal to 60% of the width w2 and 60% of the length l2 of the second package 120 and also 60% of the width w3 and 60% of the length l3 of the third package 130. In a formula:

$\min(w_1, l_1) < 0.6 \cdot w_2$ $\wedge \min(w_1, l_1) < 0.6 \cdot l_2$ $\wedge \min(w_1, l_1) < 0.6 \cdot w_3$ $\wedge \min(w_1, l_1) < 0.6 \cdot l_3$ In the example of FIG. 1a, the width w1 of the first package 110 is exactly 0.6 times the width w2 and 0.6 times the length l2 of the second package 120 and also 0.6 times the width w3 and 0.6 times the length l3 of the third package 130. The length l1 of the first package 110 is 20/9 times the width w1 of the first package 110. In other words, the package of the first type of solid-state light emitter packages is elongated.

In an embodiment, the aspect ratio between the width w1 and the length l1 of the first package 110 is smaller than or equal to 0.75. In the example of FIG. 1a, the ratio $w_1/l_1 = 9/20$. Optionally, the aspect ratio between the width w1 and the length l1 of the first package 110 is smaller than or equal to 0.6. Optionally the aspect ratio between the width w1 and the length l1 of the first package 110 is smaller than or equal to 0.5. In an embodiment, the aspect ratio between the width w2 and the length l2 of the second package 120 is in a range from 0.75 and 1. In the example of FIG. 1a, the ratio $w_2/l_2 = 1$. Optionally, the aspect ratio between the width w2 and the length l2 of the second package 120 is in a range from 0.8 and 1. Optionally, the aspect ratio between the width w2 and the length l2 of the second package 120 is in a range from 0.9 and 1. Optionally, a top view shape of the second package is a square. In an embodiment, the aspect ratio between the width w3 and the length l3 of the third package 130 is in a range from 0.75 and 1. In the example of FIG. 1a, the ratio $w_3/l_3 = 1$. Optionally, the aspect ratio between the width w3 and the length l3 of the third package 130 is in a range from 0.8 and 1. Optionally, the aspect ratio between the width w3 and the length l3 of the third package 130 is in a range from 0.9 and 1. Optionally, a top view shape of the third package is a square.

It is to be noted that it is not necessary that the whole top surface of the first package 110, of the second package 120 and the third package 130 emits, in use, light. In practical embodiments, a light emitting surface of the first package 110, of the second package 120 and of the third package 130 is about 75% of the top surface of said package, or, optionally, about 85% of the top surface of said package, and at an edge of the top surfaces said packages do not emit light. Optionally, if the top surface of the packages is square, the light emitting part of the top surface may be circular, square or semi-square (e.g. rounded corners). Optionally, if the top surface of the packages is rectangular, the light emitting part of the top surface may be ellipse shaped, rectangular or semi-rectangular (e.g. rectangle with rounded corners). Optionally, said packages 110, 120, 130 have their light emitting surface at their top surface and not at any one of their side surfaces. The invention is not limited to packages that only emit light at their top surface. The invention also works if the packages emit light along more surfaces of the package.

In FIG. 1a an ellipse shaped envelope 150 is drawn around the arrangement of the first package 110, the second package 120 and the third package 130. This ellipse shaped envelope 150 has a center 152. In the example of FIG. 1a, the first package 110 is arranged on the center 152. In the example of FIG. 1a, the second package 120 and the third package 130 are arranged adjacent to the first package 110 and are arranged at opposite sides of the first package 110. In the example of FIG. 1a, the second package 120 is adjacent to one of the longer sides of the first package 110—the 3th package is adjacent to another one of the longer sides of the first package 110. Adjacent to means in the context of this document that the packages are arranged close to each other, but do not have to touch each other. In many practical embodiments there must be a space in between the packages, for example, such that an electrical conductive track can be arranged in between two neighboring packages 110, 120, 130. In general, there are design rules which define the minimum distance between neighboring packages. Adjacent may be interpreted as the distance between neighboring packages is about the minimum distance that is defined in applicable design rules. Adjacent may be interpreted as, the distance between neighboring packages is at least smaller than the smallest of the widths and lengths of the first, second and third packages.

In the example of FIG. 1a, there are three different types of packages. The inventors have found that if there are three or more types of packages that emit different colors of light, it is advantageous to have one package that has in one direction a dimension that is at least 60% smaller than the dimensions of the other packages and that then this smaller package must be placed at the center and the other two packages should be placed at opposite sides of the smaller package. In use, this results in a better light emission in which the first color of light, the second color or light and the third color of light are better mixed along the whole light emission. One obtains this effect because the distance between the second package 120 and the third package 130 is relatively small because the relatively small first package 110 is only arranged in between them.

Figure 7:
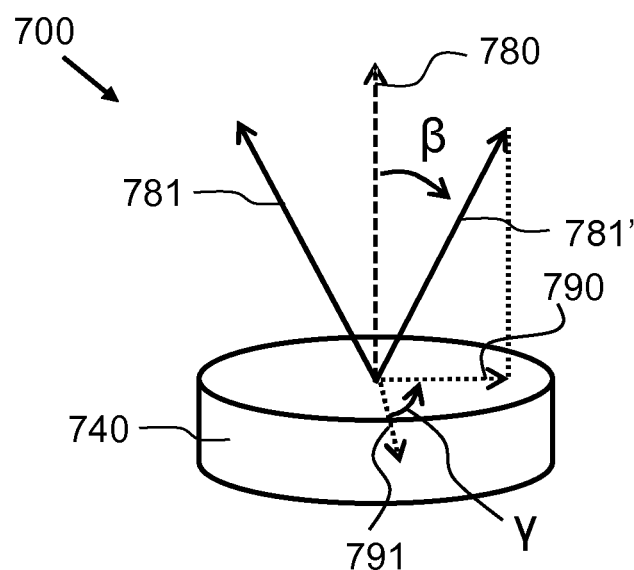

FIG. 7 schematically shows a substrate 740 on which, from a central location, a light beam is emitted. This light beam has a central axis 780 and comprises light rays, for example, light rays 781, 781'. The light emission direction of each light ray 781, 781' can be characterized with two angles, namely an angle $\beta$ between the light ray 781' and the central axis of the light beam and an angle $\gamma$ between a predefined direction 791 in a virtual plane parallel to the surface of the substrate 740 and a projection 790 of the light ray 781' in this virtual plane.

Often, if a light beam is emitted, a highest, or relatively high, light intensity is emitted along the central axis 780 of the light beam. Often, with increasing angles $\beta$ with respect to the central axis 780 the emitted light intensity decreases. It is seen with traditional arrangements of solid-state light emitter packages of different types that with increasing angles $\beta$ also the emitted color deviates more from a required color (having a color point (u', v')), in other words, with increasing angles $\beta$Du'v' increases. It is observed by the inventors and it is simulated by the inventors that with the arrangement of the packages of FIG. 1a and with the other embodiments discussed in this document the Du'v' is lower with increasing angles $\beta$ compared to the traditional arrangements of solid-state light emitter packages of different types. Thus, in other words, the color of the emitted light remains more uniform in the light beam. As will be discussed later, if there are more packages of the first type, at least two of them should be placed close to the center and intersect with a virtual line through the center. Thereby the same effect is obtained as the above discussed effect. In particular, the effect that is discussed in this paragraph is observed to a higher extent if the light emitting assembly of the invention is used in combination with a beam forming optical element such as collimating optics.

Figure 1B:
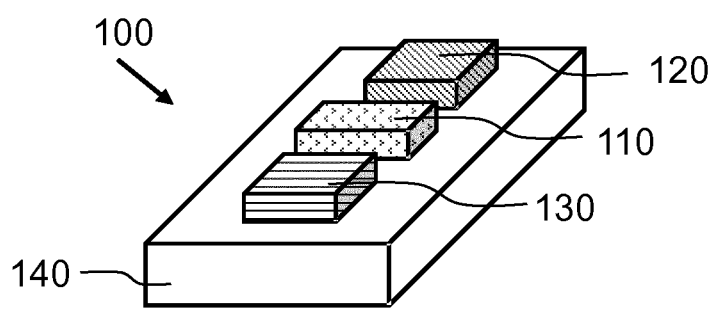

FIG. 1b schematically shows a three-dimensional view of the embodiment of the light emitting assembly 100 of FIG. 1a. In the three-dimensional view, the three-dimensional shape of the substrate 140, the first package 110, the second package 120 and the third package 130 are shown.

It is to be noted in the context of FIGS. 1a and 1b, that the substrate may comprise electrical conductive paths to provide power to the packages 110, 120, 130. The design of the electrical conductive paths may be such that all packages 110, 120, 130 receive the same driving signals, in other words, that all packages 110, 120, 130 form a group and that their light emission is controlled with one signal. The design of the electrical conductive paths may also be such that all packages 110, 120, 130 can receive individual driving signal that can be controlled individually, for example, to obtain a specific emitted light intensity. If the light emissions of the individual packages can be controlled individually one has a light emitting assembly of which the color of the emitted light can be controlled as well. The electrical design may be such that all packages form one group and are controlled as one group. The electrical design may be such that there are sub-groups in the set of all packages and that the sub-groups can be controlled independently of each other. The electrical design may be such that each package can be controlled independently. The remarks of this paragraph may also apply to all embodiments discussed hereinafter.

Figure 2A:
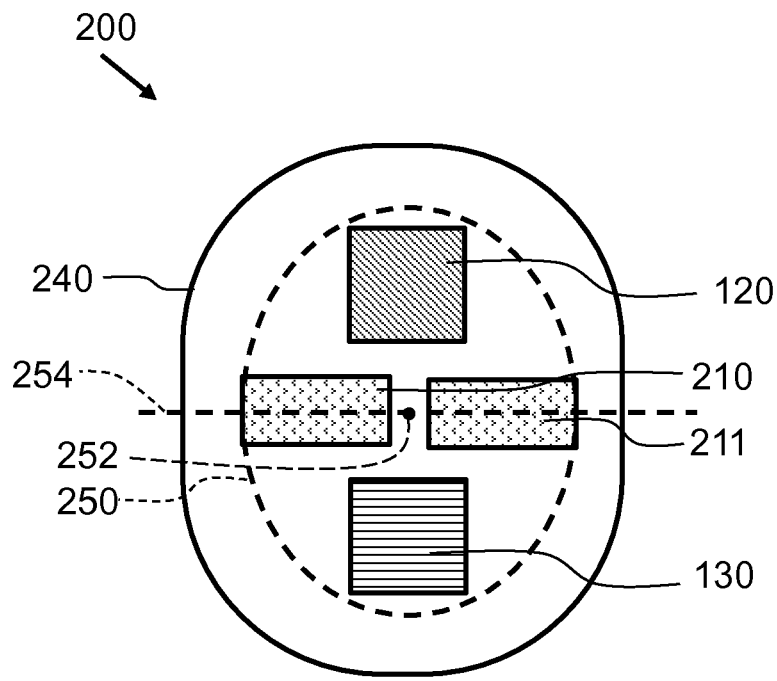

FIG. 2a schematically shows a top view of a second embodiment of a light emitting assembly 200. Light emitting assembly 200 is similar to light emitting assembly 100 of FIG. 1a and has similar effects and advantages. Where appropriate, embodiments of light emitting assembly 100 may also be combined with light emitting assembly 200. Differences are discussed hereinafter.

Light emitting assembly 200 has a slightly wider substrate 240 on which two first packages 210, 211 of the first type of solid-state light emitter package are provided and on which a second package 120 and a third package 130 are provided. Dimensions of the first package 210, 211, the second package 120 and the third package 130 are comparable with the dimensions of the packages of the light emitting assembly 100.

An ellipse shaped envelope 250 is drawn around the packages and a center 252 of the ellipse shaped envelope 250 is drawn. A virtual line 254 through the center 252 is drawn as well. In the embodiment of FIG. 2a, the two first packages 210, 211 are arranged adjacent to the center 252 and are arranged on the virtual line 254. In other words, the virtual line intersects with the two first packages 210, 211. In the specific embodiment of FIG. 2a, the longitudinal direction of the two first package 210, 211 is parallel to the virtual line. Parallel to each other must be interpreted within the practical limitations of manufacturing techniques, and, thus, deviation of 0 to 5 degrees are still considered to be parallel. Optionally, deviations of 0 to 2 degrees are still considered to be parallel. Also in this context adjacent must be interpreted that the two first packages 210, 211 are arranged close to each other, however, practical limitation may define that a minimum distance must be respected between them. Optionally, the first two package 210, 211 are arranged as close as possible to the center 252. The second package 120 and the third package 130 are arranged adjacent to the two first packages 210, 211 on the virtual line 254 and they are arranged at opposite sides of the virtual line 254. The second package 120 and the third package 130 are also provided as close as possible to the first packages 210, 211.

In another embodiment (not shown) there are three first packages of which one is arranged on the center 252, and the other two first packages are also arranged on the virtual line and adjacent to the central first package and the longitudinal direction of the three first packages follows the direction of the virtual line.

Figure 2B:
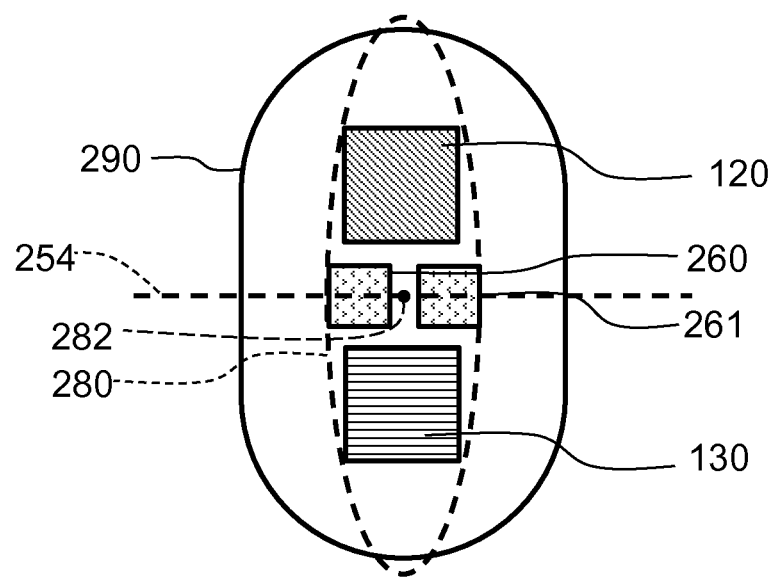

FIG. 2b schematically shows a top view of a third embodiment of a light emitting assembly 250. Light emitting assembly 250 is similar to light emitting assembly 200 of FIG. 2a and has similar effects and advantages. Where appropriate, embodiments of light emitting assembly 200 may also be combined with light emitting assembly 250. Differences are discussed hereinafter.

Light emitting assembly 250 may have a substrate 290 that is slightly smaller than the substrate of light emitting assembly 200. The first packages 260, 261 that are provided in the light emitting assembly 250 are smaller than the first package 210, 211 of FIG. 2a. In the embodiment of FIG. 2b, the first packages 260, 261 have a top surface that is square shaped. The width and length of the top surface of the first package 260, 261 is smaller than 60% of the width and length of the top surface of the second package 120 and of the top surface of the third package 130—in the example of FIG. 2b the width and length of the top surface of the first packages 260, 261 is 53% of the width and length of the square shaped top surfaces of the second package 120 and of the third package 130. Consequently, the envelope 280 with center 282 is shaped differently.

Figure 3:
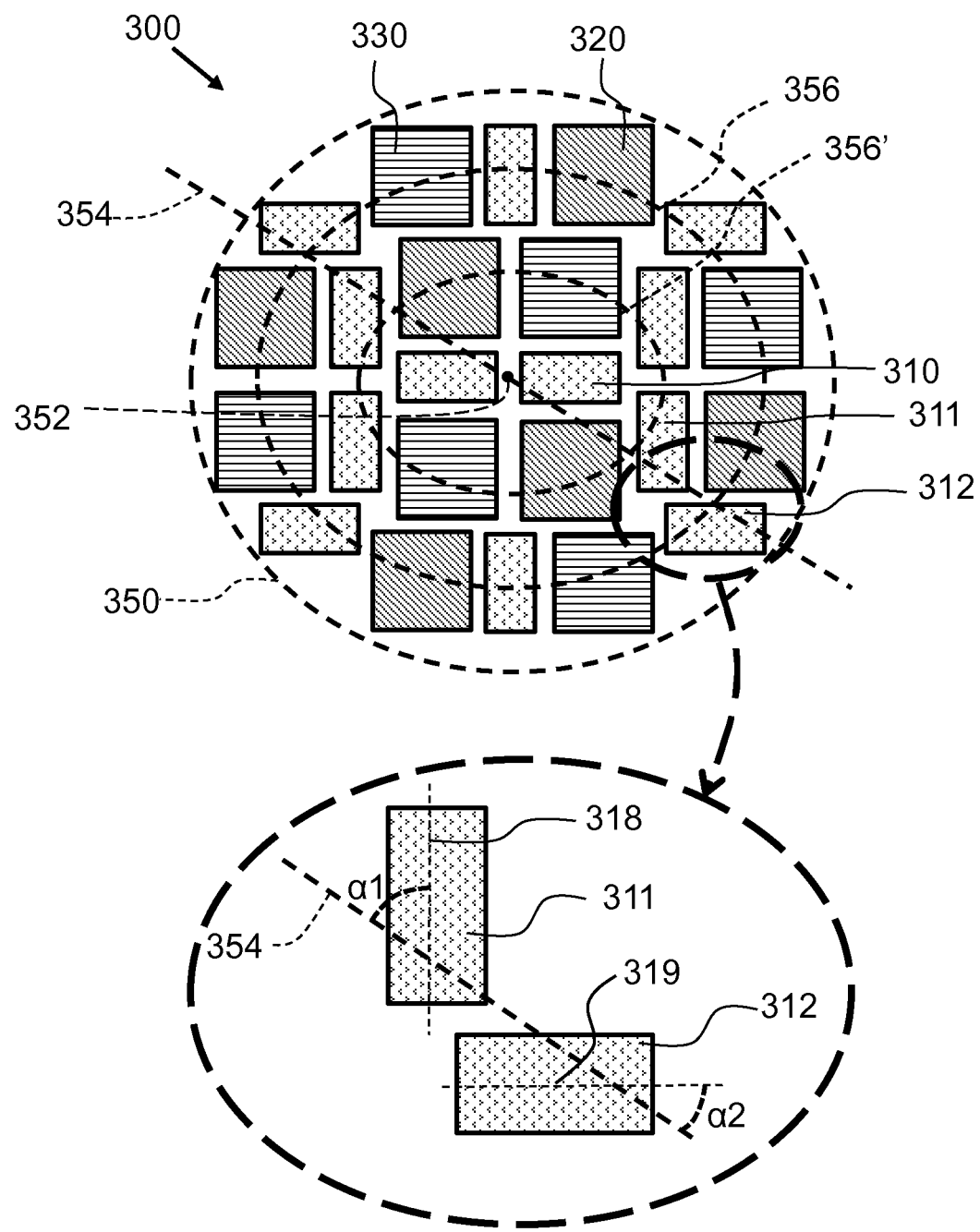

FIG. 3 schematically shows a top view of a fourth embodiment of a package arrangement 300 on a substrate (not shown separately) of a light emitting assembly together with an enlargement of a section of the embodiment. The package arrangement 300 can be used in previously discussed light emitting assemblies. Where appropriate the substrate of the previously discussed light emitting assemblies must be adapted is size and in electrical design for the package arrangement 300. Previously discussed embodiments may also be combined with the package arrangement 300 and previously discussed effects and advantages may also apply to package arrangement 300. In the package arrangement 300 not all packages are indicated with a reference number. The same types of solid-state light emitter packages are indicated by an equal hatching pattern.

In the package arrangement 300 twelve first packages 310, 311, 312 of a first type of solid-state light emitter package are combined with six second packages 320 of a second type of solid-state light emitter package and six third packages 330 of a third type of solid-state light emitter package. The first type of solid-state light emitter packages have an elongated top surface and the second and third type of solid-state light emitter packages have a square top surface. A smallest side of the elongated top surface of the first type of solid-state light emitter packages is slightly smaller than 60% of the sides of the top surfaces of the second and third solid-state light emitter packages.

The complete package arrangement 300 falls within an ellipse shaped envelope 350 that has a center 352. Through the center 352 a virtual line 354 is drawn. Two first packages 310 are arranged adjacent to the center 352 and intersect with the virtual line 354. Four more first package 311, 312 intersect with the virtual line 354 and they are arranged, seen along the line, adjacent to each other. As is shown in the enlarged portion at the bottom end of FIG. 3, elongated directions 318, 319 of the first packages 311, 312 form and angle $\alpha_i$ with the virtual line. The angles $\alpha_i$ are smaller than 60 degrees. Thereby, all six first package 310, 311, 312 form a sort of line of first packages in the package arrangement 300. All other first package, all second packages 320 and third packages 330 are, as far as possible, homogeneously distributed within the space inside the ellipse shaped envelope 350 that is not yet filled with the first packages 310, 311, 312 that intersect with the virtual line 354. The distribution is such that the package arrangement is, seen in a top view, point symmetrical with respect to the center 352.

The distribution of the first package that do not intersect with virtual line 354, all second packages 320 and third packages 330—in this paragraph further called the remaining packages—is additionally performed on basis of another placement guideline. The remaining packages are arranged along two virtual ellipses 356', 356" that have a center that coincides with center 352. On each one of the two virtual ellipses 356', 356", adjacent remaining packages are of another type. In other words, each pair of neighboring packages on the virtual ellipse comprise two different types of packages. For example, the second package 320 that is on virtual ellipse 356 has on the virtual ellipse 356 no neighbor that are of the second type of solid-state light emitter package. Actually, the second package that is indicated with 320 in FIG. 3 has two first packages as its neighbors. It must be noted that the first packages that intersect with the virtual line 354 are not taken into account in this placement guideline. Alternatively, only the second and the third package follow this placement guideline. For example in the context of FIG. 3, the virtual ellipse 356' intersects with (in clockwise direction and a start at about 11 o'clock) a second package, a third package, a first package, another first package (that can be ignored in this placement guideline because it intersects with the virtual line 354), a second package, a third package, a first package and a further first package (that can be ignored in this placement guideline because it intersects with the virtual line 354). The advantage of placing on the virtual ellipses 356, 356' the packages in a sort of alternating manner is that no tangential lines of packages of the same type are present in the package arrangement 300. Tangential lines of packages of the same type may result in a relatively bad color mixing. For the best color mixing, radial lines should also have alternating types of packages, however, this cannot always be prevented. If choices must be made between tangential lines of packages of the same type or radial lines of packages of the same type (see for example in FIG. 4), radial lines are preferred.

Specific advantages of the package arrangement 300 are that more light power can be emitted because of the larger number of packages and that a better color mixing can be obtained because a larger number of packages can be distributed more homogeneously over the substrate of the light emitting assembly.

Figure 4:
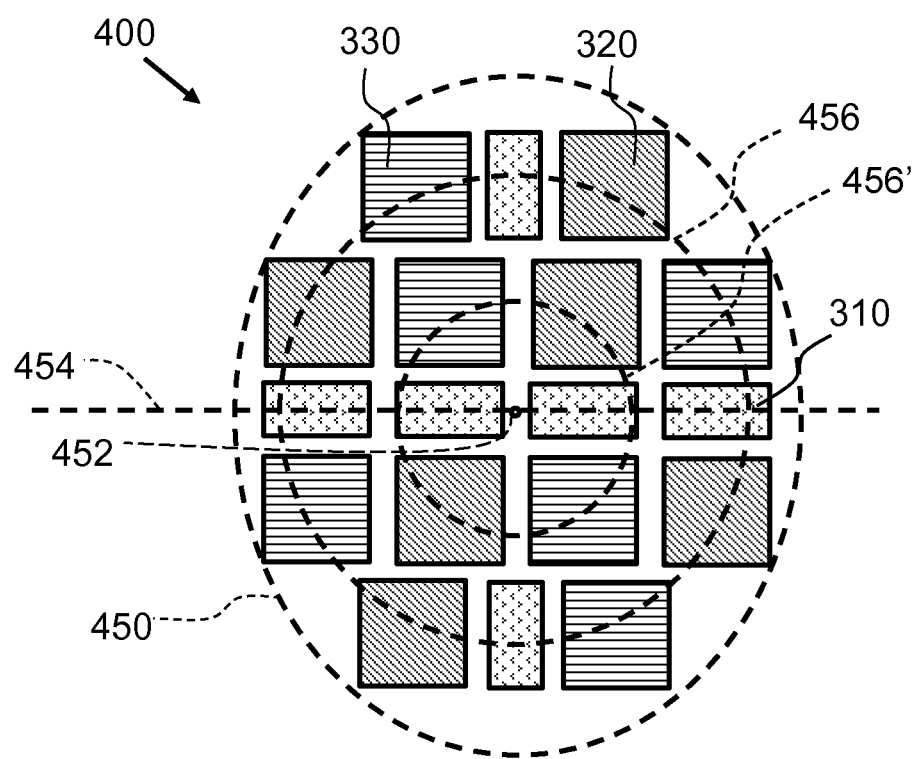

FIG. 4 schematically shows a top view of a fifth embodiment of a package arrangement 400 on a substrate (not shown separately) of a light emitting assembly. The package arrangement 400 can be used in previously discussed light emitting assemblies. Where appropriate the substrate of the previously discussed light emitting assemblies must be adapted for the package arrangement 400. Previously discussed embodiments may also be combined with the package arrangement 400 and previously discussed effects and advantages may also apply to package arrangement 400. In the package arrangement 400 not all packages are indicated with a reference number. The same types of solid-state light emitter packages are indicated by an equal hatching pattern.

In the package arrangement 400 comprises six first packages 310 of a first type of solid-state light emitter package, six second packages 320 of a second type of solid-state light emitter package and six third packages 330 of a third type of solid-state light emitter package.

FIG. 4 shows a virtual ellipse shaped envelope 450 that has center 452 and shows virtual circles 456, 456' that are concentric with respect to the center 452. FIG. 4 also present a virtual line 454 through the center 452. A sequence of four first packages 310 are provided on the virtual line. The four first packages 310 are arranged symmetrical on the virtual line 454 with respect to the center 452 and two central first packages are adjacent to the center 452.

All first packages that do not intersect with the virtual line 454, the second packages 320 and the third packages 330 are termed the remaining packages in this paragraph. The remaining packages are distributed along the space within the ellipse shaped envelope 450 that is not used for the first packages 310 that are on the virtual line 454. The remaining packages may be substantially equally distributed along this space. The remaining package may be distributed such that a point symmetrical package arrangement is obtained. Substantially equally distributed means about uniformly distributed over the space. However, it must be noted that his is not always possible depending on required minimum distances between the packages, the number of packages to be placed, etc.

Also in this example of the package arrangement 400 the remaining packages are distributed along the two virtual circles 456, 456' such that each one of the remaining packages on the virtual circle 456, 456' has no neighbor package of the same type. For example, on virtual circle 456 (seen in a clockwise direction and starting at 12 o'clock) the sequence of remaining packages is: first, second, third, second, third, first, second, third, second, third package. For example, on virtual circle 456' (seen in a clockwise direction and starting at 11 o'clock) the sequence of remaining packages is: third, second, third, second package. The package arrangement 400 is point symmetrical with respect to the center 452.

Figure 5:
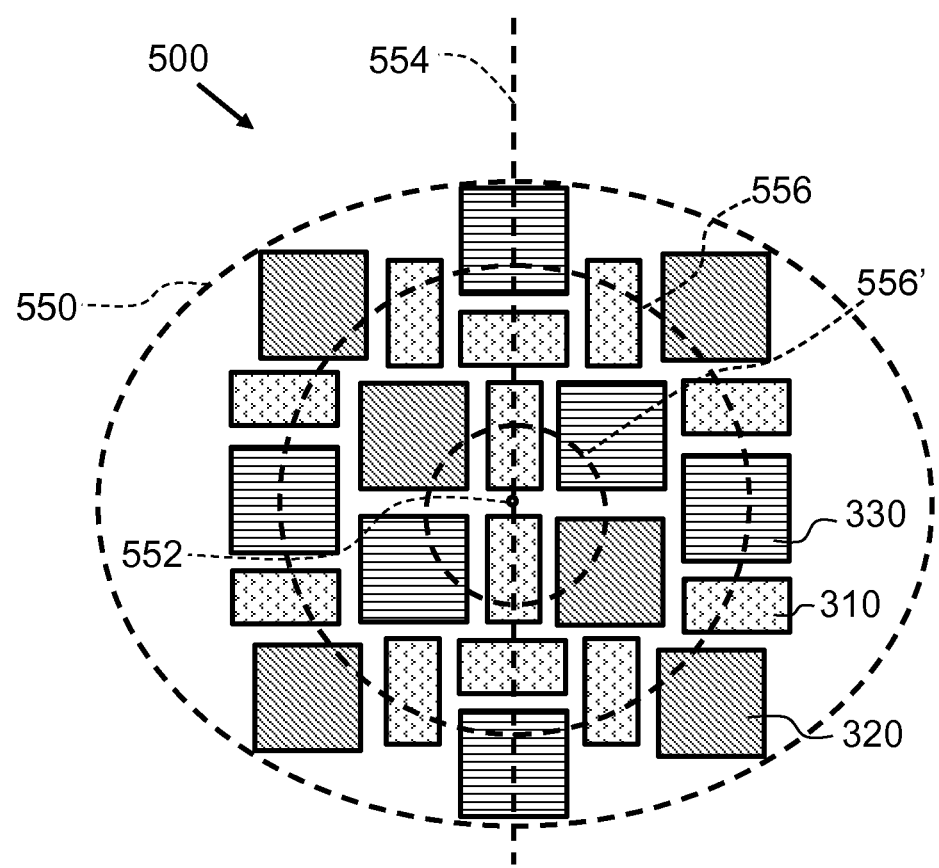

FIG. 5 schematically shows a top view of a sixth embodiment of a package arrangement 500 on a substrate (not shown separately) of a light emitting assembly. The package arrangement 500 can be used in previously discussed light emitting assemblies. Where appropriate the substrate of the previously discussed light emitting assemblies must be adapted for the package arrangement 500. Previously discussed embodiments may also be combined with the package arrangement 500 and previously discussed effects and advantages may also apply to package arrangement 500. In the package arrangement 500 not all packages are indicated with a reference number. The same types of solid-state light emitter packages are indicated by an equal hatching pattern.

Near a center 552 of an ellipse shaped envelope 550 two first packages are arranged on the virtual line 554 through the center 552 at a position adjacent to the center 552 and the longitudinal direction of the two first packages is parallel to the virtual line 554. Adjacent to these two first packages are arranged two further first packages on the virtual line 554 and these two further first packages are arranged with their longitudinal direction perpendicular to the virtual line 554. All remaining packages, i.e. the first packages 310 that do not intersect with the virtual line 554, the second packages 320 and the third packages 330 are arranged around the center 552 and are, as far as possible, equally distributed over the space within the ellipse shaped envelope 550. In line with previous embodiments of the package arrangements 300, 400, the remaining packages are distributed along two virtual circles 556, 556' that have a center that coincides with the center 552. Along the virtual circles 556, 556', each remaining package does not have a neighbor package of the same type. It is to be noted that the package arrangement 500 is point symmetrical with respect to the center 552.

Figure 6:
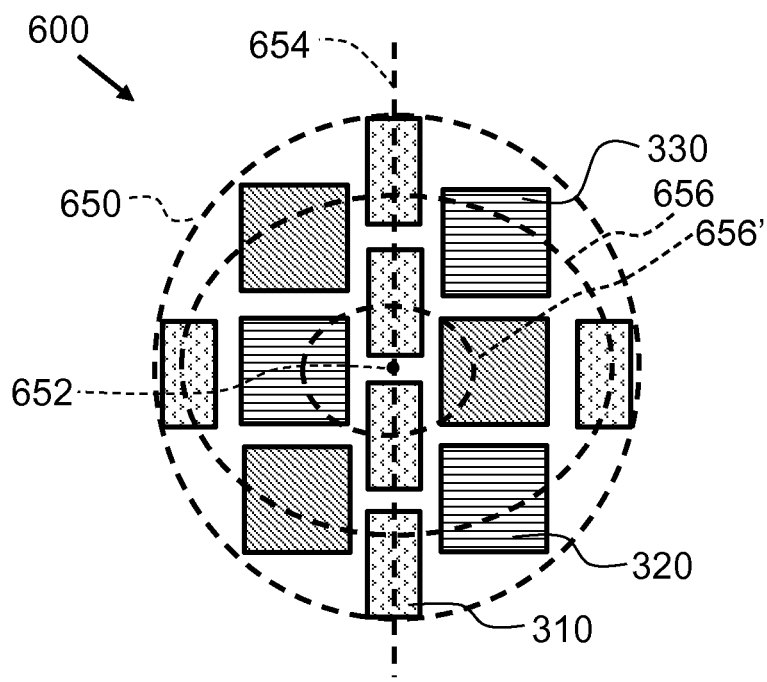

FIG. 6 schematically shows a top view of a seventh embodiment of a package arrangement 600 on a substrate (not shown separately) of a light emitting assembly. The package arrangement 600 can be used in previously discussed light emitting assemblies. Where appropriate the substrate of the previously discussed light emitting assemblies must be adapted for the package arrangement 600. Previously discussed embodiments may also be combined with the package arrangement 600 and previously discussed effects and advantages may also apply to package arrangement 600. In the package arrangement 600 not all packages are indicated with a reference number. The same types of solid-state light emitter packages are indicated by an equal hatching pattern.

Four first packages 310 are arranged on a virtual line 654 through a center 652. The center 652 is a center point of an ellipse shaped envelope 650 around the package arrangement 600. All packages that do not intersect with the virtual line 654 are arranged on two virtual ellipses 656, 656' that have a center that coincides with the center 652. The packages that do not intersect with the virtual line may intersect with one of the two virtual ellipses 656, 656' and have, seen along the virtual ellipse 656, 656' on which they are arranged, two neighbors of a different type.

FIG. 7 schematically shows different angles β, γ of light rays 781, 781' of an emitted light beam. FIG. 7 is discussed previously. In the previous discussion one of the important advantages of the invention is that with increasing angle β, the homogeneity of the emitted light remains relatively good. It is also advantageous if the color of light is relatively homogenous along different angles γ. The inventors have found that, and have simulated that, the package arrangements 300, 400, 500, 600 of FIGS. 3, 4, 5, 6, respectively, provide a relatively low Du'v' along different angles γ, also for light rays distributed along different angles β. The inventors have simulated the light emissions of some of the above discussed embodiment and they have found that the Du'v' values for different angles β and for different angles γ are lower than the Du'v' values at these angles of embodiments wherein one of the packages is not smaller and/or is not provided on or adjacent to the center on a virtual line through the center. In particular, the effects that are discussed in this paragraph are observed to a higher extent if the light emitting assembly of the invention is used in combination with a beam forming optical element such as collimating optics.

Figure 8:
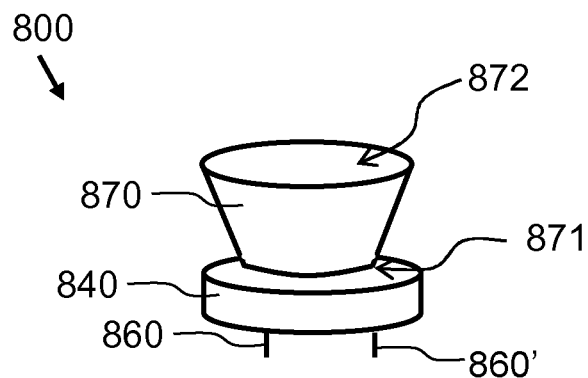

FIG. 8 schematically shows an embodiment of a spot lamp 800. The sport lamp 800 comprises at least a light emitting assembly according to the previously discussed embodiments, a beam forming optical element for shaping the emitted light beam. In the example only the substrate 840 of the light emitting assembly can be seen. The substrate additionally comprises power connectors 860, 860' for receiving power for the solid-state light emitters that are provided in the solid-state light emitter packages. The packages/packages arrangements of the light emitting assembly is provided at a light entry side of the optical element. In the example of FIG. 8, the optical element is a reflector 870 that has a light output opening 872 and a light input opening 871. The packages are provided in the light input opening 871 and are, therefore, not visible in FIG. 8. The packages emit their light into the reflector 870. A part of the light emitted by the packages is transmitted directly into the surroundings of the spot lamp 800, while another part of the emitted light impinges on the reflector and is, subsequently, reflected into the light beam that is emitted into the surroundings. In practical embodiments, the substrate with packages is as close as possible to the light entry side or the light input window/opening of the beam forming optical element/reflector.

In particular, in a spot lamp, it is advantageous if the packages are placed as close as possible to each other in the package arrangement, such as in the package arrangements 300, 400, 500, 600. If they are placed as close as possible, a relatively concentrated light beam is emitted by the light emitting assembly and then it is relatively easy to obtain a concentrated, well collimated, light beam with a reflector. As close as possible means that, in so far possible, required minimum distances between neighboring packages are respected. As close as possible may also be interpreted that the distances between neighboring packages is smaller than the smallest one of the widths or lengths for the first, second and third type of solid-state light emitter packages.

Instead of a reflector, other beam forming optical elements may be used. It may be a collimating optical element. It may be a lens. It may be a combination of a lens and a reflector. Optionally, the optical axis of the beam forming optical element coincides with the center of the ellipse shaped envelope of the light emitting assembly.

Figure 9:
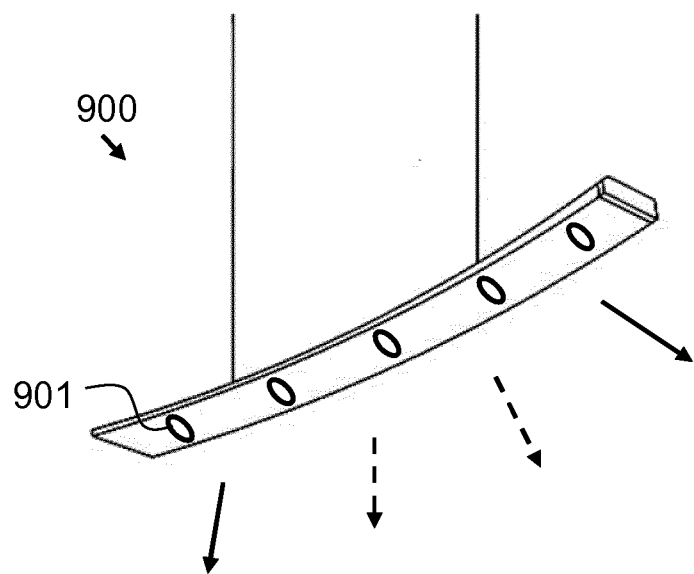

FIG. 9 schematically shows an embodiment of a luminaire 900. The luminaire may comprise one or more light emitting assemblies according to previously discussed embodiments. The luminaire 900 may also comprise one or more embodiments of the previously discussed spot lamp 901.

In summary, this document provides a light emitting assembly, a spot lamp and a luminaire. The light emitting assembly comprises at least one first package with a solid-state light emitting a first color of light, a second package with a solid-state light emitter emitting a second color of light and a third package with a solid-state light emitter emitting a third color of light. The first package has a smallest side that is at least 60% smaller than the sides of the second package and the third package. The packages are provided on a substrate. Seen in along a view direction towards a top surface of the substrate: an envelope around said packages is a circle or an ellipse having a center, one first package is positioned on the center, or two first packages are provided at positions adjacent to the center and intersect with a virtual line through the center.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting assembly comprising:
at least two first packages of a first type of solid-state light emitter package being configured to emit a first color of light,
a plurality of second packages of a second type of solid-state light emitter package being configured to emit a second color of light,
a plurality of third packages of a third type of solid-state light emitter package being configured to emit a third color of light, wherein, seen in a top view, a smallest side (w1) of the first type of solid-state light emitter package is at least smaller than 60%, seen in the top view, of the width (w2, w3) and of the length (l2, l3) of the second type of solid-state light emitter package and of the third type of solid-state light emitter package,
a substrate on which the first package, the second package and the third package are provided, wherein, seen along a viewing direction towards a surface of the substrate on which said packages are provided,
a shape of an envelope around said first, second and third packages is a circle or an ellipse, the circle and the ellipse having a center, the envelope being tangential to and/or intersecting the corner of the packages,
two first packages are provided at positions adjacent to the center and intersect with a virtual line through the center,
wherein the first packages that do not intersect with the virtual line, the plurality of second packages and the plurality of third packages are substantially equally distributed along a space within the envelope that is not used for the first packages that intersect with the virtual line.

2. A light emitting assembly according to claim 1, wherein the first type of solid-state light emitter package is, seen in a top view, elongated.

3. A light emitting assembly according to claim 2, wherein a longitudinal direction of each one of the two first packages forms an angle ($\alpha_1$, $\alpha_2$) with respect to the virtual line, the angles ($\alpha_1$, $\alpha_2$) are smaller than 60 degrees.

4. A light emitting assembly according to claim 2, wherein the longitudinal directions of the two or more first packages follow the virtual line.

5. A light emitting assembly according to claim 1, wherein the first packages that intersect with the virtual line are arranged in a point symmetrical manner with respect to the center.

6. A light emitting assembly according to claim 1, wherein the second package and the third package are arranged adjacent to and at two opposite side of the first package or the two first packages.

7. A light emitting assembly according to claim 1 comprising a plurality of second packages and a plurality of third packages, wherein remaining packages are the first packages that do not intersect with the virtual line, the plurality of second packages and the plurality of third packages, the remaining packages are distributed along a space within the envelope that is not filled with the first packages that intersect with the virtual line such that the remaining packages intersect with one of one or more virtual concentric ellipses around the center, and along the one or more concentric ellipses adjacent packages are of a different type.

8. A light emitting assembly according to claim 1, wherein all packages are distributed along the substrate in a point symmetrical manner with respect to the center.

9. A light emitting assembly according to claim 1, wherein the first type of solid-state light emitter package has, seen in a top view, an aspect ratio between a shortest side (w1) of the first type of solid-state light emitter package and a longest side (l1) of the first type of solid-state light emitter package is smaller than 0.75.

10. A light emitting assembly according to claim 1, wherein at least one of the second type of solid-state light emitter package and the third type of solid-state light emitter package have, seen in a top view, an aspect ratio between a shortest side (w2, w3) and a longest side (l2, l3) within a range from 0.75 to 1.

11. A light emitting assembly according to claim 1, wherein, seen in a top view, distances between neighboring packages on the substrate are smaller than the shortest side (w1) of the first type of solid-state light emitter package, wherein a distance between neighboring packages is the shortest distance of a side edge of one package to a side edge of another neighboring package.

12. A light emitting assembly according to claim 1, further comprises a beam forming optical element for shaping a light beam for emission into a surroundings of the light emitting assembly, the substrate with said packages being arranged at a light entry side of the beam forming optical element and, optionally, a central optical axis of the beam forming optical element coincides with the center.

13. A spot lamp comprising a light emitting assembly according to claim 1.

14. A luminaire comprises a light emitting assembly according to claim 1.

\* \* \* \* \*